US010271075B2

(12) United States Patent
Bertolotti et al.

(10) Patent No.: US 10,271,075 B2
(45) Date of Patent: Apr. 23, 2019

(54) CLOUD ENCODING SYSTEM

(71) Applicant: Sky Italia S.R.L., Milan (IT)

(72) Inventors: Massimo Bertolotti, Milan (IT); Fabio Sonnati, Milan (IT)

(73) Assignee: Sky Italia S.R.L., Milan (IT)

( * ) Notice: Subject to any disclaimer, the term of this patent is extended or adjusted under 35 U.S.C. 154(b) by 0 days.

(21) Appl. No.: 15/029,794

(22) PCT Filed: Oct. 14, 2014

(86) PCT No.: PCT/IB2014/002095
§ 371 (c)(1),
(2) Date: Apr. 15, 2016

(87) PCT Pub. No.: WO2015/056075
PCT Pub. Date: Apr. 23, 2015

(65) Prior Publication Data
US 2016/0249078 A1 Aug. 25, 2016

(30) Foreign Application Priority Data

Oct. 15, 2013 (IT) .............................. MI2013A1710

(51) Int. Cl.
*H04N 7/173* (2011.01)
*H04N 21/2343* (2011.01)
(Continued)

(52) U.S. Cl.
CPC .... *H04N 21/23439* (2013.01); *H03M 7/6011* (2013.01); *H03M 7/6017* (2013.01);
(Continued)

(58) Field of Classification Search
CPC ....... H04N 21/2343; H04N 21/234363; H04N 21/234381; H04N 21/23439
See application file for complete search history.

(56) References Cited

U.S. PATENT DOCUMENTS 6,407,680 B1   6/2002  Lai et al.
6,917,945 B2*  7/2005  Vicars-Harris ...... H04N 21/235
(Continued)

FOREIGN PATENT DOCUMENTS

EP      2293570 A1      3/2011
WO      WO 01/55855     8/2001
WO      2012/006151 A2  1/2012

OTHER PUBLICATIONS

International Search Report of the International Searching Authority dated Jan. 26, 2015, issued in connection with International Patent Appln. No. PCT/IB2014/002095 (3 pages).
(Continued)

*Primary Examiner* — Pankaj Kumar
*Assistant Examiner* — Timothy R Newlin
(74) *Attorney, Agent, or Firm* — McCarter & English, LLP

(57) ABSTRACT

A system (and corresponding method and devices) for encoding an ungrouped signal into a plurality of grouped signals, wherein the ungrouped signal comprises at least a video service. The system further comprises:
  a first encoding means provided in a production system configured to execute a first encoding of the ungrouped video signal into a first encoded grouped signal and to associate encoding information with the first encoded signal;
  a second encoding means provided in a distribution system, wherein the second encoding means is separate from said first encoding means and is configured to execute a plurality of second encodings so as to correspondingly obtain the plurality of grouped signals, each of the plurality of grouped signals characterized by a corresponding predetermined property, wherein the second encodings are performed on the basis of said first encoded signal using the encoding information;

(Continued)

a connection means configured to transmit the encoding information from the first encoding means to the second encoding means, wherein the encoding information comprises information on the first encoding.

20 Claims, 5 Drawing Sheets

(51) Int. Cl.
H03M 7/30 (2006.01)
H04N 21/222 (2011.01)
H04N 21/2662 (2011.01)
H04N 21/61 (2011.01)

(52) U.S. Cl.
CPC ........ *H03M 7/6064* (2013.01); *H04N 21/222* (2013.01); *H04N 21/234309* (2013.01); *H04N 21/234363* (2013.01); *H04N 21/2662* (2013.01); *H04N 21/6125* (2013.01)

(56) References Cited

U.S. PATENT DOCUMENTS

| 9,276,978 | B2* | 3/2016 | Takahashi | H04L 65/60 |
|---|---|---|---|---|
| 2003/0067989 | A1* | 4/2003 | Yoshinari | G11B 27/034 |
| | | | | 375/240.25 |
| 2008/0013627 | A1 | 1/2008 | Tahara et al. | |
| 2010/0158098 | A1* | 6/2010 | McSchooler | H04N 21/2368 |
| | | | | 375/240.01 |
| 2010/0158126 | A1* | 6/2010 | Bai | H04N 21/23430 |
| | | | | 375/240.16 |
| 2011/0268178 | A1* | 11/2011 | Park | H04N 21/23439 |
| | | | | 375/240.02 |
| 2012/0222063 | A1* | 8/2012 | Mao | H04N 7/17318 |
| | | | | 725/31 |
| 2012/0275509 | A1* | 11/2012 | Smith | H04N 19/147 |
| | | | | 375/240.01 |
| 2013/0094566 | A1* | 4/2013 | Milstein | H04N 19/63 |
| | | | | 375/240.02 |
| 2013/0114744 | A1* | 5/2013 | Mutton | H04N 19/40 |
| | | | | 375/240.26 |
| 2013/0308699 | A1* | 11/2013 | Musser, Jr. | H04N 19/85 |
| | | | | 375/240.03 |
| 2014/0108592 | A1* | 4/2014 | Meijer | H04L 67/2823 |
| | | | | 709/217 |
| 2014/0247887 | A1* | 9/2014 | Brueck | H04N 19/40 |
| | | | | 375/240.26 |
| 2014/0351871 | A1* | 11/2014 | Bomfim | H04L 65/4084 |
| | | | | 725/93 |
| 2015/0373385 | A1* | 12/2015 | Straub | H04N 21/23412 |
| | | | | 725/34 |

OTHER PUBLICATIONS

Written Opinion dated Jan. 26, 2015, issued in connection with International Patent Appln. No. PCT/IB2014/002095 (7 pages).

* cited by examiner

CLOUD ENCODING SYSTEM

RELATED APPLICATIONS

This application is a U.S. National Phase Application under 35 U.S.C. 371 of International Application No. PCT/IB2014/002095 filed Oct. 14, 2014, which was published on Apr. 23, 2015, under International Publication Number WO 2015/056075 A1, which claims the benefit of Italian Patent Application No. MI2013A001710 filed on Oct. 15, 2013. These applications are incorporated herein by reference in their entirety.

FIELD OF THE INVENTION

The present invention relates to a system for encoding ungrouped signals into grouped signals in two steps.

BACKGROUND OF THE INVENTION

With the advent of the Internet the transmission of audio and video content, in a linear or non-linear mode (e.g. VOD, catch-up, etc . . . ), has undergone enormous expansion and the dissemination of terminals that can receive audiovisual signals (smartphones, tablets, PCs, connected devices, etc . . . ) has likewise increased. Unfortunately, there exists no common standard for serving all the devices connected to the network (each of which with a different screen and resolution). For this reason it is necessary to prepare the content with different formats (for example Smoothstreaming, http Live Streaming, Mpeg DASH, . . . ) and for each format, in order to guarantee the end customer the maximum user experience, different compression profiles (bit rates) have to be prepared in order to be able to deliver content from the Internet to the end customer in conformity with the latter's connection bandwidth.

Therefore, for any one item of content, or audiovisual channel, for example, 8 levels of compression must be generated: from the one defined "audio-only" (e.g. 32 or 64 Kbps) or "level 8", to the "HD" high resolution format (e.g. 3 or 4 Mbps) or "level 1"; each of the levels must often be rendered in at least 2 or 3 formats, which can result in a total of 24 copies of the same content and/or channel with different features.

In order to ensure maximum quality and efficiency, the compression is performed starting from the original signal or content to which the quality of production corresponds (for example, HD with video quality requiring a bandwidth even greater than 50-100 Mbps, up to 10 Gbps for live content).

Maximum efficiency means having the best quality at the lowest possible bit rate. In fact, for the content provider, as well as for the global network, each bit saved implies savings of transmission resources and thus a better overall use of resources.

Therefore, being able to compress audiovisual content in the best possible way by containing the bit rates for each level while ensuring the highest possible quality represents a technical challenge for distribution over the Internet.

Once these numerous copies of the same content/channel have been created, the content/channel has to be transmitted over the Internet 24 times (since each customer can have a different connectivity at any given time). Therefore, the transmission resources necessary (and hence the costs) are n times greater than if a single content item/channel were to be sent over the Internet. In the case of VOD, it follows that the required storage capacity is also n times greater.

If a Content Delivery Network (CDN) is used for distribution to end customers, the situation does not change: in this case, as well, 24 copies of the content/channel must be managed.

Obviously, this system is scarcely efficient for distribution, but it is the best insofar as video quality is concerned, since "lossy" compression, be it MPEG 2, AVC, HEVC or any other format, will be better the higher the quality of the source is.

Recently, numerous solutions have been made available (for example by Amazon and Verizon) which involve compressing content directly over the Internet (via cloud computing), avoiding the need for the service provider (media company) to manage a complex compression chain; however, such solutions entail sending content over the network in a scarcely efficient manner and usually involve a complete outsourcing of transcoding services to the cloud provider, taking away all control from the media company.

In detail, such solutions require the content provider (or media company) to send a single content item/channel and then compression into the different formats and bit rate levels takes place over the network (or over the CDN, prior to distribution to the end customer or prior to storage of non-linear content such as VOD). These solutions are conceived to set the compression systems at a common factor and lower the costs of the content provider by using encoders shared with different content providers, thus reducing their number, reducing backup and operational maintenance and improving the working speed/performance by being able always to exploit compression resources 100%. However, these solutions still present some disadvantages from a technical viewpoint. The most evident of these disadvantages is that the upload of the content/channel to the Internet occurs at a high bit rate, e.g. 50-100 Mbps or more (up to 3 Gbps or 10 Gbps for live broadcasts), as mentioned above.

The solution is thus not efficient since it requires large transmission resources (and thus implies high costs) and does not allow the media company to have any control over the distribution chain. One solution to this drawback consists in sending "pre-compressed" (mezzanine) content to the network, together with information generated by the media company on how to manage the subsequent steps of compression in the cloud, thereby optimizing the integration between the compression systems of the media company and those made available by the cloud provider. Even if pre-compressed to 10 Mbps (i.e. to a level that is not too low), such content generally loses a great deal of information (compared to the 50-100 Mbps of a video source with HD quality); therefore, the subsequent multiformat/bit rate compression operation will be less efficient and of lower quality (even at the same bit rate) than that performed starting from content or channels with HD production quality.

Therefore, the lower efficiency means that in this latter case, in order to have the same quality for each video level, a bit rate that is 10-20% higher may be needed in order to have the same result as a transcoding that starts from a high quality source (for example, the highest level in the compression and transcoding option will be 5 Mbps when starting from a 10 Mbps source, whereas when starting from a high quality source at 50 Mbps, it will be possible to arrive at 4 Mbps without compromising quality, and so on for lower levels). Moreover, a transcoding system not completely outsourced to the cloud and including a pre-compression step in the production centre of the media company, in addition to reducing the costs of transmitting the pre-compressed content, benefits from the generation of encoding information at the level of the media company in an accurate manner such as only processing in the media company's production centre can guarantee.

None of the known systems, moreover, envisages the advantages deriving from a management of the transcoding system which includes a pre-compression step managed by the production centre of the media company combined with the generation of further levels of encoding by a virtualized distribution centre, such as a Content Delivery Network, while at the same time enabling high levels of encoding quality to be reached at the various levels to be generated.

SUMMARY OF THE INVENTION

The present invention has been conceived with the aim of providing even only a partial remedy for at least one of the problems recognised by the inventors, for example as described above.

According to a first aspect, the invention provides a system for encoding an ungrouped signal into a plurality of grouped signals said ungrouped signal comprising at least a video service, the system comprising:
- a first encoding means provided in a production system configured to execute a first encoding of said ungrouped video signal into a first encoded grouped signal (140) and to associate encoding information (140) with said first encoded signal;
- a second encoding means (160) provided in a distribution system, said second encoding means being separate from said first encoding means, and configured to execute a plurality of second encodings so as to correspondingly obtain said plurality of grouped signals (180), each of said plurality of grouped signals (180) characterised by a corresponding predetermined property, said second encodings performed on the basis of said first encoded signal using said encoding information;
- a connection means configured to transmit said encoding information (140) from said first encoding means (150) to said second encoding means (160), wherein said encoding information (140) comprises information on the first encoding.

According to a second aspect, the invention provides a method for encoding an ungrouped signal into a plurality of grouped signals, said ungrouped signal comprising at least a video service, the method comprising the steps of:
- executing (S100), via a first encoding means provided in a production system, a first encoding of said ungrouped video signal into a first encoded grouped signal and associating (S110) encoding information (140) with said first encoded signal;
- executing (120), via a second encoding means (160) provided in a distribution system and distinct from said first encoding means, a plurality of second encodings so as to correspondingly obtain said plurality of grouped signals (180), each of said plurality of grouped signals (180) characterised by a corresponding predetermined property, said second encodings obtained starting from said first encoded signal using said encoding information;
- transmitting (S130) said encoding information from said first encoding means to said second encoding means, wherein said encoding information comprises information on the first encoding.

According to a third aspect, the invention provides a computer program configured to execute, when said program is run on a computer, all of the steps according to the above-described method according to the second aspect.

According to a fourth aspect, the invention provides a device (350) for encoding an ungrouped signal (310) into a grouped signal (390), said ungrouped signal (310) comprising at least a video service, said device comprising:
- an encoding means (355) configured to execute a first encoding of said ungrouped video signal into a first encoded grouped signal and to associate encoding information with said first encoded signal;
- a transmission means (370) for transmitting said first encoded signal and encoding information to a further encoding device configured to execute a plurality of second encodings so as to correspondingly obtain a plurality of grouped signals (180), each of said plurality of grouped signals (180) characterised by a corresponding predetermined property, said second encodings obtained starting from said first encoded signal using said encoding information, wherein said encoding information comprises information on the first encoding.

According to a fifth aspect, the invention provides a device (460) for encoding a first encoded grouped signal (410) into a plurality of grouped signals (390), said first encoded grouped signal (410) comprising at least a video service, said device comprising:
- a receiving means (445) for receiving said first encoded grouped signal and encoding information comprising information on the first encoding from a further encoding device;
- an encoding means (465) configured to execute a plurality of second encodings so as to correspondingly obtain said plurality of grouped signals (180), each of said plurality of grouped signals (180) characterised by a corresponding predetermined property, said second encodings obtained starting from said first encoded signal using said encoding information.

Auxiliary aspects will be illustrated below with reference to the various embodiments, and examples will be provided for the purpose of illustrating the invention.

LIST OF FIGURES

DETAILED DESCRIPTION

The inventors have designed a system for managing encoding (for example pre-compression) in a coupled manner within a traditional transmission system which enables the creation of content at a maximum resolution and bit rate and transcoding (for example compression) in a cloud or CDN.

The term cloud indicates a series of technologies which make it possible, usually in the form of a service offered by a provider to the customer, to memorise, store and/or process data thanks to the use of hardware/software resources distributed and virtualized in a network.

The computers making up the cloud can be located, or be selected to be located (also automatically), in a position that is more advantageous than the position of the media company or production centre in terms of nearness of the video or audiovideo content to the end user. Or else, the cloud network can have computer connections toward the end user of the video or audiovideo content that are faster than the computer connection of the media company or production centre.

The system of the present invention is suitable for content distribution over the Internet to devices of different form and nature (smartphones, tablets, PCs, connected devices, etc . . . ).

The solution of the present invention envisages sending a first encoding of the desired content to the cloud. This first encoding can consist in a compression at the highest level of compression quality (i.e. highest bit rate or highest resolution or in any case best visual quality) that it is desired to obtain among all the output levels of compression it is wished to obtain from the process.

The encoding information (as defined below) is associated with this content so as to generate the other desired encodings in the cloud. These other encodings can consist in further compressions, to obtain which the computer program that is run in the cloud can exploit the encoding information previously obtained so as to enable better qualitative results or better exploitation of the bandwidth or of the computing resources. All the versions of the content that can be requested by different users via different devices such as smartphones, tablets, personal computers, etc. are thus made available in the cloud.

Figure 1:
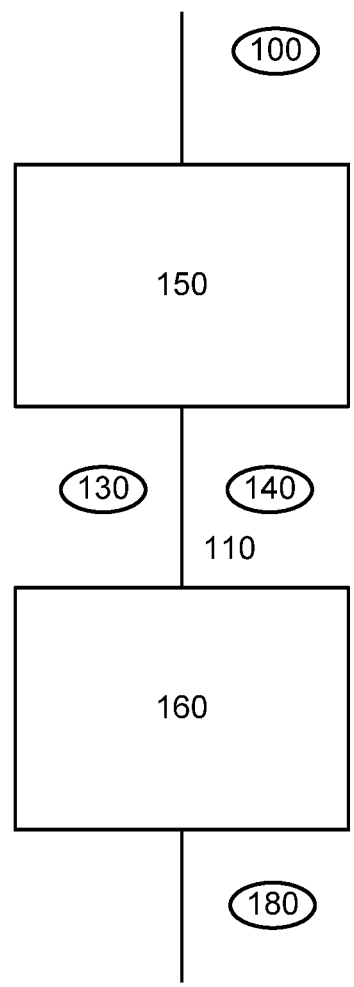
FIG. 1 illustrates a block diagram of a method for encoding signals according to a first embodiment.

A system for encoding an ungrouped signal 100 into a grouped signal 180 will now be described with reference to FIG. 1. Signal means a content item comprising at least a video service; the signal can however also include at least either an audio service or data service (for example, data for the user, the application and/or data for the application) and/or further video/audio/data services. Grouped signal means a video signal whose pictures or frames are organised into groups in which the information contained in each frame following the first can depend on the previous and/or next frame, in such a way as to reduce the bandwidth necessary for transmitting the group of frames. The first frame cannot normally be derived from the other frames of the group. Examples of grouped signals are: MPEG, AVI, XVID, DIVX, http Live Streaming (HLS), MPEG, DASH, SmoothStreaming, AVC etc.

Ungrouped signal, on the other hand, means a video signal without the above-mentioned group structure. Examples of ungrouped formats are SDI, SD HD, etc.

In the present invention, the ungrouped signal 100 can be generated by a production system or centre. Examples of production centres (or systems) are a television studio or a centre comprising devices such as a television camera (for example of the television studio), a connection to a content distributor for receiving signals from the latter (for example, films directly from the company in possession of the rights and the originals), a local memory (on which films or programs are recorded for example), etc. . . . The ungrouped signal can occupy a fairly wide bandwidth, such as, for example, 50 Mbps or greater (as said earlier, even 3 or 10 Gbps in the case of a live event).

The above-mentioned ungrouped signal comprises at least a video service (but can also comprise audio and/or data services). A video service can be a stream of images, an animation, a documentary, a film, a sporting event, or any other content made up of frames.

The bit rate of a grouped signal can be considerably lower than the bit rate of the ungrouped signal it derives from. For this reason it is preferable to upload video or audio-video signals that have been encoded into grouped signals through telematic or wireless networks.

The system for encoding the signal 100 comprises the first encoding means 150. The first encoding means 150 transforms the ungrouped signal 100 into a grouped signal 130, thus executing an encoding of the content referred to as the first encoding (it should be noted that the invention works in the same manner if the first signal is already grouped, that is, if the signal 100 is a grouped signal, in which case the first encoding can entail a further compression or solely a format change). The first encoded signal 130 can occupy a considerably smaller bandwidth than the ungrouped signal 100, for example 5-10 Mbps (as opposed to a source having a bit rate, for example, of 50-100 Mbps), and its format can be, for example, MPEG4 with a resolution of 1920×1080 dots.

The system for generating the first grouped signal, called mezzanine, can conveniently not exploit standard techniques for generating mezzanines, such as, for example a CBR (Constant Bit Rate) encoding, but rather encodings aimed at introducing a controlled reduction in quality and thus a substantial transparency of the mezzanine with regard to the source for the specific encoding process (i.e. the reduction in quality introduced in the mezzanine compared to the source is within a tolerance required by the process so as not to impair the quality of the final renditions in a perceivable manner). This approach to the generation of the mezzanine optimises quality and bit rate.

The aims in generating the mezzanine are to maintain a level of quality comparable to the original while reducing the bit rate as much as possible to facilitate the uploading of the first pre-encoding (or mezzanine) to the cloud for the subsequent processing steps. One technique that can be used to generate mezzanines is CBR encoding. This approach tends to render the space occupied by the file per unit of time uniform, but it cannot be optimal either for preserving the quality of the original, or for reducing the bit rate. The nature of modern video compression techniques (for example AVC or HEVC), in which the compression factor that may be achieved changes profoundly with variations in the complexity of the source (for example, motion scenes are more complex than fixed planes) is poorly suited to CBR encoding. When CBR encoding is carried out to provide an acceptable level of quality in each part of the video it is necessary to set a very high bit rate, which is in contradiction with the need to reduce the bit rate as much as possible.

Therefore, in order to create an optimised mezzanine it is preferable to use VBR (Variable Bit Rate) encodings, which allow more data to be allocated to complex scenes and less data to simple scenes so as to obtain a more favourable quality/bit rate ratio and ensure more consistent quality throughout the whole video.

In particular, even more benefits can be derived by using techniques that aim to produce "controlled" reductions in the quality of the output compared to the source. For example, it is possible to use a constant quantisation factor or, even better, a quantisation factor that varies according to frame type, but with a mobile, constant and controlled average. This makes it possible to maintain the reduction in quality within the margins defined by the encoding process based on the required output quality/resolution and bit rate, and at the same time minimises the bit rate necessary for obtaining said level of quality. Therefore, starting from information on the first encoding (i.e. on the encoding of the mezzanine), such as, for example, the quantisation factor used for a given frame or set of frames, as well as the properties of the signal desired after the second encoding, it is possible to optimise the second encoding. For example, the second encoding can be made simpler and/or faster, for example by exploiting the encoding information in order to avoid superfluous steps in view of what had already been encoded (for example: if the encoding information indicates that a given frame or GOP had already been compressed to the maximum degree, the second encoding can avoid processing it any further and move on to other frames or GOPs for which there is still room for compression). According to a another example, the encoding information can indicate that a frame and/or GOP needs not undergo further compression if its first compression is already satisfactory (for example above a given threshold, or if a corresponding indicator bit is provided), or that it can be further compressed (for example if the first compression falls between a first threshold and a second threshold, depending on whether time and/or computing resources are available, or whether a corresponding indicator bit is provided), and/or that it must be further compressed (for example if its compression falls below a further threshold, or if a corresponding indicator bit is provided). The same considerations as in the previous example can be applied to a more or less extended set of frames/GOPs, i.e. the information on the level of compression can be indifferently provided for a frame, a GOP or a set thereof. The second encoding can also be controlled so that it maintains an excellent quality even when a further compression is performed: for example, on the basis of the encoding information, such as the quantisation ratio used, the second encoding will be able to evaluate which other parameters can be varied in processing a given frame or GOP in order to increase its compression while ensuring the desired property or quality of the signal that must be produced by the second encoding. Therefore, the first encoding information can include information on the level of encoding or level of compression of at least part of the first encoded signal. The second encoding means will thus be able to execute the second encoding on the basis of such information on the level of encoding (or level of compression) of the first signal.

The first encoding means 150 is located at the production system (or centre). Moreover, the first encoding means associates encoding information 140 with the first encoded signal 130. This encoding information is information that makes it possible to generate a second encoded signal having predetermined properties based on the characteristics of the first encoded signal (or a plurality of second encoded signals, as illustrated further below; for the sake of simplicity, the present description will make reference to one second encoded signal, but what is described for this signal also applies for the other signals of the plurality of second encoded signals unless otherwise indicated or implied). In particular, the encoding information can comprise configuration parameters and/or characteristic parameters.

The configuration parameters represent constraints for the generation of the second encoded signal having the predetermined properties (i.e. properties that are desired in view of the use or in view of the final device that will exploit the content): for example, constraints that the second encoder must comply with when encoding the first encoded signal to generate the second encoded signal.

The characteristic parameters represent properties of the first encoded signal, and can include parameters describing how the first encoding was performed (for example, during its operation the first encoder is set so as not to compress certain frames below a certain level of compression). It should be noted that the configuration parameters and the characteristic parameters can be contained in the same packet (i.e. unit of information) or in two or more distinct packets. Moreover, the encoding information 140, in the form of either one or more separate packets, can be included in the video stream of the first encoded signal, or else separate therefrom and transmitted at the same time or at different times.

The encoding information 140 can moreover be transmitted to the second encoding means 160 before the first encoded signal 130, or else afterwards, or else it can be transmitted simultaneously (for example in parallel, or multiplexed), provided that the second encoding means is able to start processing the first encoded signal having all the necessary information at its disposal.

The characteristic parameters can include, for example, one or more among: the composition of the GOP (Group of Pictures), the bit rate curve, quality metrics, the compression ratio introduced, if any, information on the quantisation matrix and information on the motion vector associated with the first encoding. In other words, the characteristic parameters can be said to represent the history of the first encoded signal, i.e. how it was obtained and/or what characteristics distinguish it.

The configuration parameters can include, for example, at least one among: the bit rate, resolution and format (for example MPEG, AVI, XVID, DIVX, http Live Streaming (HLS), MPEG, DASH, SmoothStreaming, AVC) of the second encoded signal. The encoding information 140 can further include every other item of information that was derived from first encoding means during the production of the first encoded signal 130 and that is useful for the production, by the second encoding means 160, of the second encoded signal.

The second encoding means 160 is a separate device (in the sense of distinct, or physically distinct and separate) from the first encoding means and can be located in a distribution centre (or system), (though this is not necessary, as it can be located in any other centre or place provided that it is connected to the first encoding means, it being possible to make the connection with or without wires). Examples of a distribution centre are a cloud or a CDN. The second encoding means 160 is configured to execute a second encoding starting from the first encoded signal 130 so as to output a plurality of second encoded signals 180. To this end, the second encoding comprises a plurality of second encodings, each of said second encodings configured to obtain one of the second encoded signals. The various second encodings can be performed in parallel, via suitable hardware-software means, or in a temporal series, for example if the same hardware-software means are used. The second encoding, moreover, uses the encoding information 140 to output the second encoded signals 180.

The encoding information, and in particular the characteristic parameters, enable the second encoding to proceed on the basis of certain information (such as, for example, the GOP structure, or complexity) which needs not be recomputed or newly obtained from the ungrouped content. This has the advantage of limiting the computing resources and/or bandwidth and/or time necessary for completing the second encoding.

The second encoded signal is likewise a grouped signal comprising at least a single frame or picture. It is obtained starting from the first encoded signal by analysing its grouped structure, applying the constraints and exploiting the characteristics associated with the first encoding content in the encoding information 140.

An attempt will be made to illustrate what has been disclosed with an example: the second encoding means 160 receives a frame of the first encoded signal; the encoding information indicates that this frame has not been compressed (or only minimally and/or partially compressed) and the desired output is a signal having a resolution and/or bit rate equal to half that of the input signal. The second encoding means 160 thus proceeds to perform a second encoding with a higher compression factor. When the second encoding is performed on a larger number of encoded frames of the first encoded signal, it is possible to derive further advantages, as in the following example: the encoding information indicates that the first encoded signal has GOPs having an average length of 2 s and maximum length of 2.5 s, and that the output signal must have two thirds of the resolution and bit rate of the first encoding signal. On the basis of this encoding information and a plurality of frames (possibly all the frames) of the first encoded signal, the second encoding will seek to increase the average and maximum length of the GOP of the output signal and/or to increase the level of compression of each frame. In this manner, it will be possible to obtain an output signal having the desired properties and having the maximum quality obtainable, since the second encoding can choose the best encoding/compression strategy in view of the characteristic information of the first encoded signal (the same also applies for the other signals to be output, if necessary).

The above-described system further comprises a connection means 110 which enables the first encoded signal 130 and the encoding information 140 to be transmitted from the first encoding means 150 to the second encoding means 160. This connection means is information carrier devices or techniques. Examples of such devices are: electrical conductors for carrying signals, telematic networks, wireless networks, optical cables, optical devices, signal conveying buses and electronic connections on a motherboard.

In an optional variant of the system according to this embodiment, the encoding information has descriptive parameters added to it, i.e. information about the final format or final formats it is desired to obtain by means of the second encoding means 160. If, for example, it is desired to obtain 8 levels of compression in 3 different formats as second encoded signals, the parameters related to the 8 desired bit rates, resolutions and 3 desired formats can be included in the encoding information 140 that is input to the second encoding means 160 (the example of 8 levels and 3 formats is illustrative; the same applies for i levels and j formats, with i and j set equal to or greater than 1 as desired). In this manner, the second encoding means will be able to optimise the encoding, and in particular the compression of some or all of the final formats. The information on the final formats, resolutions and desired bit rates can be included in the encoding information, can be transmitted before or after it, or multiplexed with it. Moreover, the system can optionally be configured in such a way that the first encoded signal is already ready to be automatically output as a second encoded signal of level 1 having a higher bit rate and/or resolution. In this manner, the second encoding means will only need to output the first input signal as (for example) a signal of level 1 without having to use up computing resources, which can be spent entirely on the remaining levels.

Figure 2:
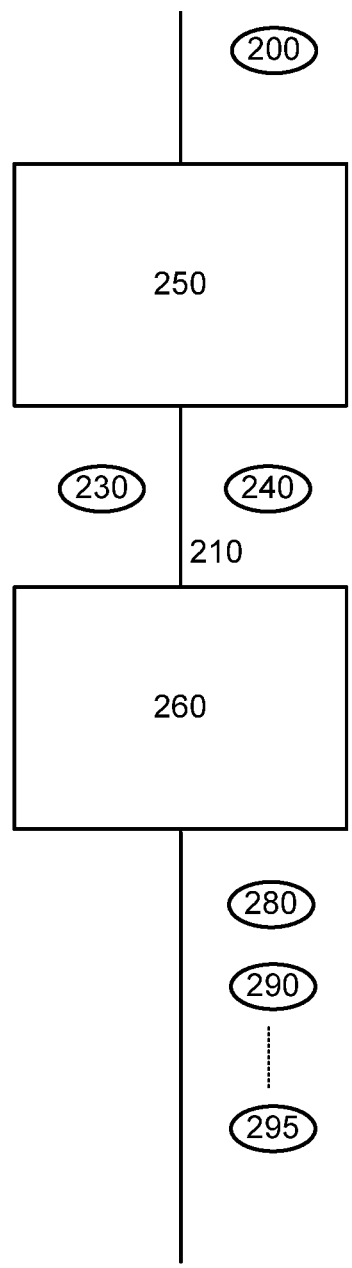
FIG. 2 illustrates a block diagram for encoding signals according to a second embodiment.

As can be seen in FIG. 2, according to an optional variant of the first embodiment, the system can be configured in such a way that the second encoding means 260 produces a multitude (plurality) of second encodings 280, 290, ... 295. The characteristics (such as, for example, one or more among: the bit rate, resolution, format or other characteristics) of each of the second encodings obtained from the second encoding means 260 are determined by the configuration parameters which may be contained in the encoding information. It should be noted that each of the encoded signals produced is characterised by a corresponding predetermined property, wherein the property indicates the characteristics or attributes of the second encoded signal that is output, such as, for example, one or more of the following: desired resolution, level of compression, bit rate, format, etc. . . . .

In an optional variant of the present invention, the second encoding means 160 carries out one of the second encodings starting from the first encoded signal 130 without the signal increasing in terms of bandwidth during the execution of that second encoding. In other words, during the operation which leads to the production of one of the second encoded signals 180, the second encoding means 160 will not occupy a bandwidth larger than is necessary to reproduce the first encoded signal 130, or, at the most, it will occupy a bandwidth corresponding to the one necessary to reproduce the first encoded signal 130 and the information on the first encoding 140 at the same time. This is because of the fact that the second encoding means 160 does not need to decode the first encoded signal in order to re-encode it into the particular second encoded signal.

If the second encoding (or one of the second encodings) consists in at least one compression, some information, such as, for example, the content or part of the content of some frames, is abandoned (or further compressed) so as to reduce the bandwidth necessary for that particular second encoded signal. Other second encoded signals can consist in larger or smaller bandwidth reductions. The first encoding means 250, the transmission means 210, and the first encoded signal can be the same as described with reference to FIG. 1. The encoding means in this variant differs from the one in FIG. 1 in that it includes information on the desired property of a number of compressed second signals.

In an optional variant of the present invention, the system transmits, via the first transmission means 110, the encoding information 140 and all other information useful for the production of the second encoded signal by the second encoding means 160. Notwithstanding the graphic representations in FIGS. 1 and 2, which are to be considered given only by way of example, this encoding information 140 can be included/encapsulated in the first encoded signal 130. In this optional variant, therefore, the format of the first encoded signal 130 is suitable for containing the encoding information 140 and the second encoding means 160 is configured to read and interpret the aforesaid format.

It should be noted that the encoding information (140) can further include information on the predetermined property of one or more of the second signals to be encoded. Therefore, in such a circumstance, the second encoding means performs the second encoding (or various second encodings) also taking into account the property desired for the output signal. For example: the encoding information indicates that a second encoded signal must have a resolution R2 (lower than the resolution R1 of the first encoding signal output by the first encoding means) and/or a certain format F1. The second encoding means thus processes the first encoded signal taking into account the history of the first encoding (see what was said earlier) and the property or attributes that the second signal must conform to, as indicated in the encoding information. It can also be said that the predetermined property of the second encoded signal represents a constraint that the second encoding means must comply with when generating the second encoded signal. If this information on the property is not included in the encoding information, the second encoding means can operate according to one of the locally available parameters (to be set locally or remotely and used until they are changed).

Figure 3:
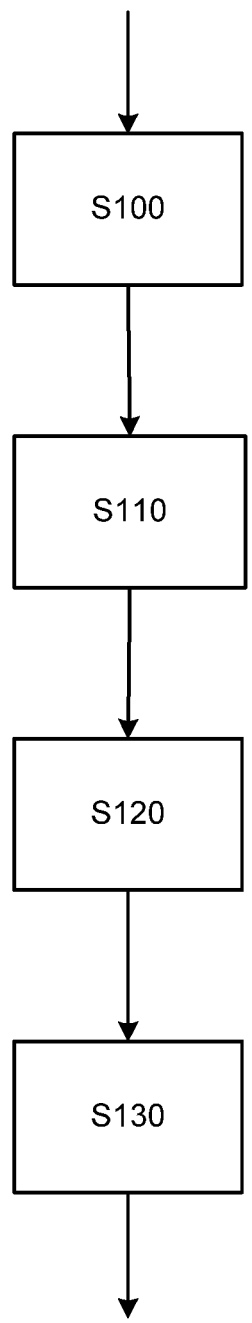
FIG. 3 illustrates a flow diagram representing a method according to a second embodiment of the present invention.

FIG. 3 illustrates a method for encoding an ungrouped signal 100 into a grouped signal in accordance with a second embodiment. The same considerations apply as set forth with reference to the first embodiment, unless otherwise specified. The ungrouped signal comprises at least a video service, and the method consists in a first step (S100) of executing a first encoding of the ungrouped video signal 100, for example via the first encoding means 150. The method associates (S110) the encoding information 140 with the first encoded signal 130. The encoding method further comprises the execution (S120) by the second encoding means 160 of a second encoding 180 (or of a number of second modifications; what is described above and below applies here, too) of the first encoded signal 130. The second encoding means 160 uses the encoding information 140 and generates a second encoded signal. Said method relies on the previously described transmission means 110 to upload (S130) the first encoded signal 130 and encoding information 140 from the first encoding means 150 to the second encoding means 160. The method can optionally comprise steps for obtaining a number of second encodings as illustrated with reference to FIG. 2. It should be noted that the steps in FIG. 3 are not necessarily illustrated in a fixed and predetermined temporal sequence. For example, it is not necessary for the transmission to begin when the first encoding has been completed. In fact, the first encoded signal can start being transmitted when at least a certain part of it has been encoded. Similarly, the second encoding can begin when at least part of the first encoded signal and part of the encoding information (for example containing sufficient information about the characteristics of the received portion of the first encoded signal) have been received.

According to one embodiment of the present invention (non illustrated), a computer program comprises instructions for performing the steps envisaged by the above-described method with the aim of obtaining the first encoded signal 130, the encoding information 140 and the second encoded signal 180 or, if the instructions provide for the production of multiple second encoded signals, the second encoded signals 280, 290, . . . 295 described with reference to FIG. 2. Said program can be run by a single computer on one or more microprocessors, also working in parallel, or else by a computer system consisting in a number of computers connected to one another. In particular, the computer program that implements the instructions for the second encoding can be run on networks of delocalised computers called clouds, as defined previously. Said program can reside, i.e. be memorised, on a fixed disk or system of fixed disks, on a computer other than the one or ones that execute the instructions, on a CD-ROM, DVD, Blue-Ray, flash memory or any other data storage medium. The medium the computer program is memorized on can be remote from the computer means that runs its instructions, for example it can reside in the cloud, or its instructions can be received via a wireless network.

Figure 4:
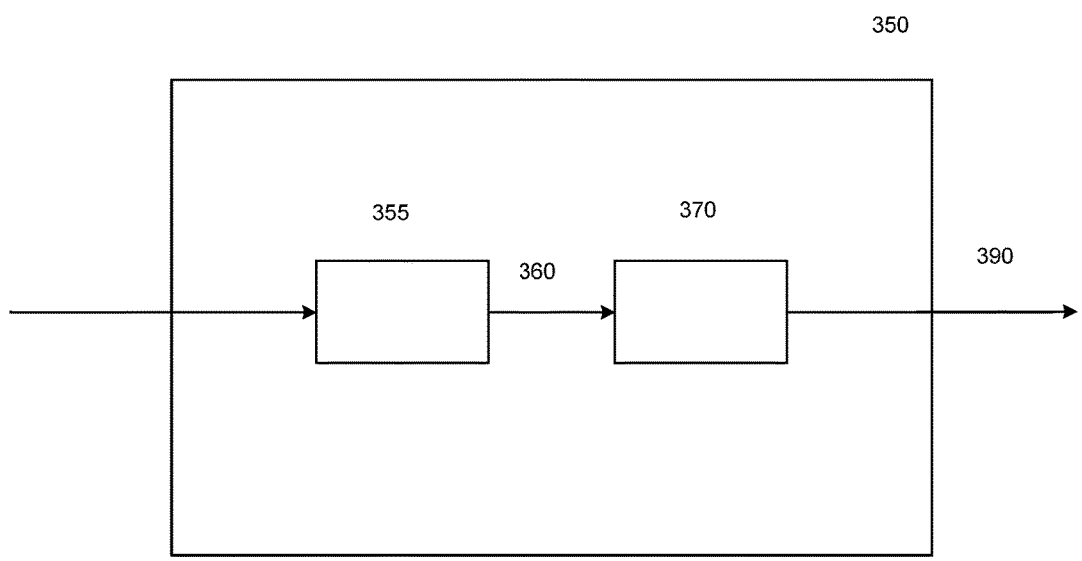
FIG. 4 represents a block diagram of a first encoding device according to a third embodiment.

FIG. 4 shows a block diagram according to a third embodiment of the present invention, where a device 350 encodes an ungrouped signal 310 into a grouped signal 390, said ungrouped signal 310 comprising at least a video service. The device 350 comprises encoding means 355 configured to execute a first encoding of said ungrouped video signal 310 into a first encoded grouped signal and to associate encoding information with said first encoded signal. The encoding information contains information obtained during the first encoding process and relating thereto and can contain configuration information for the execution of a second encoding by a further device. The encoding information can optionally contain information relating to the property of the second encoded signal that is output (or each property corresponding to a plurality of second encoded output signals). The device 350 further comprises a transmission means 370 for transmitting said first encoded signal and encoding information to a further encoding device configured to execute a second encoding (or a number of second encodings as discussed elsewhere) using the encoding information. The encoding information includes information on the first encoding and can include configuration information of the second encoding device.

Figure 5:
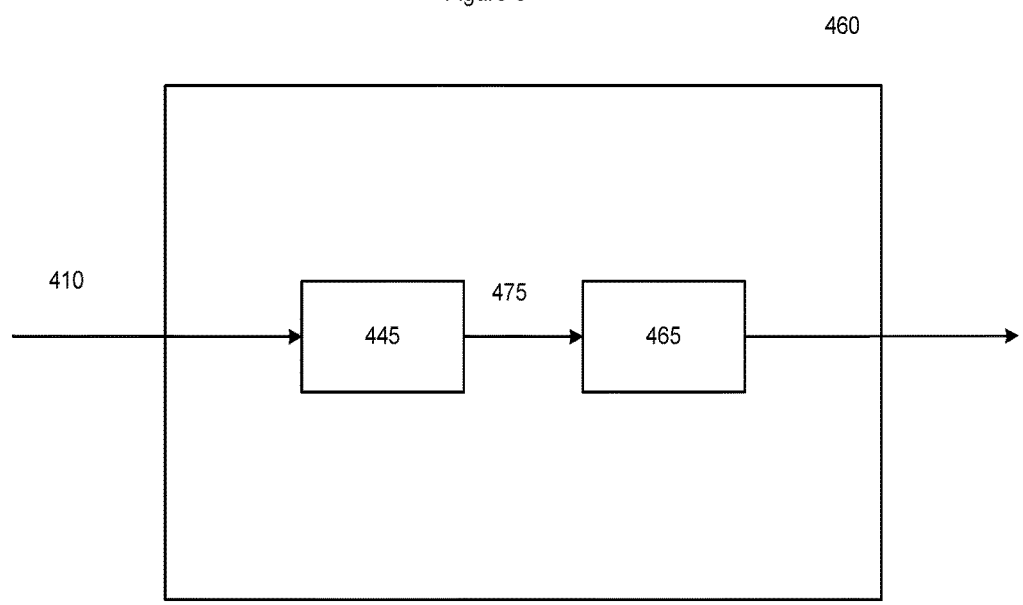
FIG. 5 represents a block diagram of a second encoding device according to a fourth embodiment.

FIG. 5 shows a block diagram of a fourth embodiment of the present invention, where a device 460 encodes a first encoded grouped signal 410 comprising at least a video service into a second grouped signal 490. The device comprises a receiving means 445 for receiving, from a further encoding device, the first encoded grouped signal 410 and the encoding information associated therewith, also including information on the first encoding. The device 460 further comprises encoding means 465 (connected to the receiving means 445 via connection means 475) configured to execute a second encoding (or a number of second modifications as already illustrated) of said first encoded signal 410 into a second encoded signal using the encoding information and possibly also configuration information which specifies the bit rate(s) and format(s) of the second grouped signal 390. It should be noted that the considerations set forth in relation to the first embodiment and the variants thereof, as also exemplified in FIGS. 2 and 3, also apply for the third and four embodiments.

Figure 6:
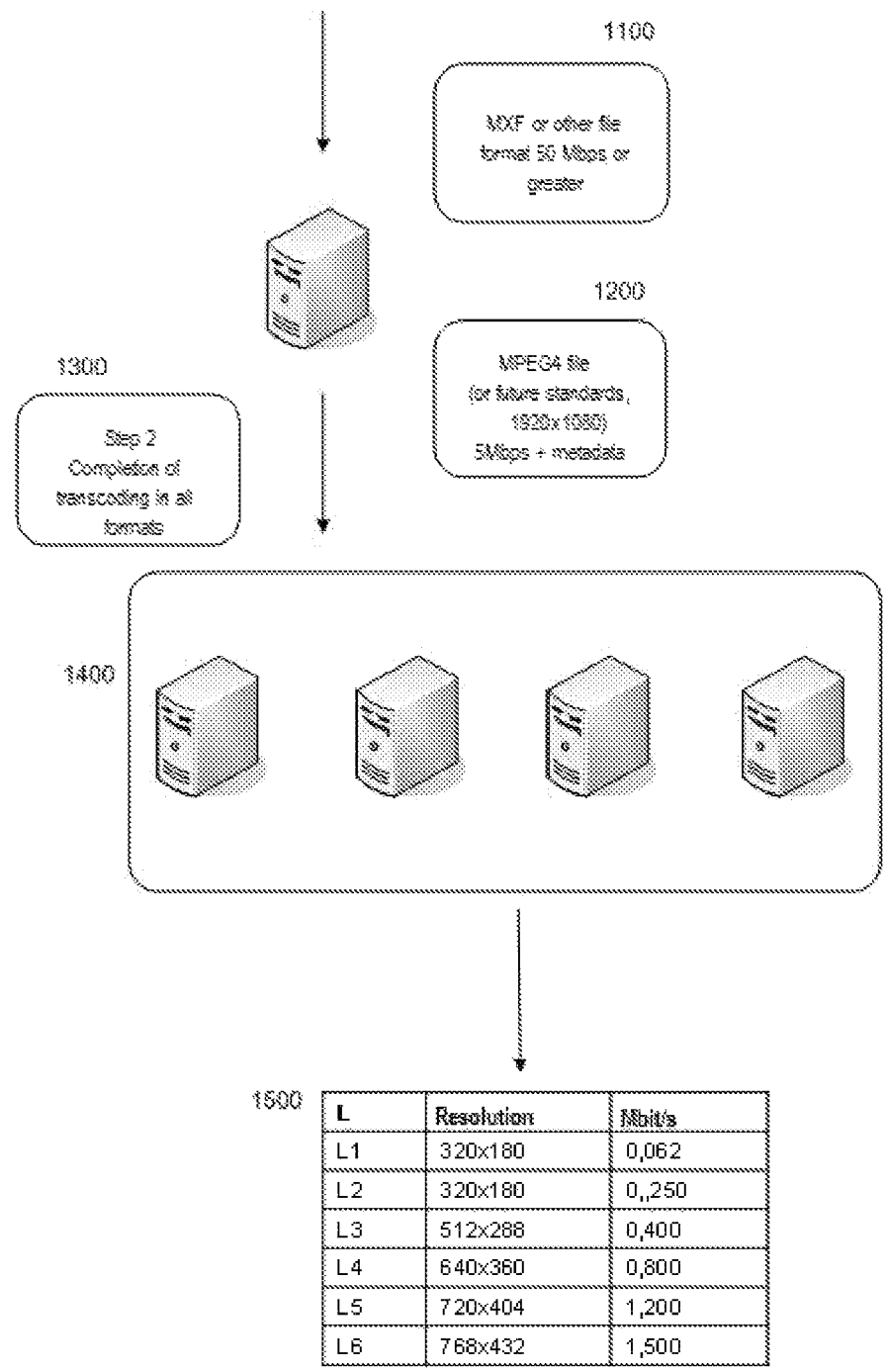
FIG. 6 shows an example of operation according to the present invention for illustrative purposes.

FIG. 6 illustrates an example of a configuration of an encoding system according to the present invention. The element 1100 represents a file in an ungrouped format which requires a bit rate of, for example, 50 Mbps (it can however be greater). This file is transcoded by a server which outputs a new file (element 1200), called mezzanine, which requires a bit rate of, for example, 5 Mbps and has an MPEG4 file format. The server is an example of a first encoding means, and can be situated in or near the production centre. Metadata are an example of data contained in the encoding information. Though in the example reference is made to MPEG4, standards other than the latter are likewise possible. A video resolution of 1920×1080 is given solely by way of example. The element 1300 (for example a cloud server or a server farm representing an example of the second encoding means) executes the second encoding, which consists in completing the transcoding and producing different formats. The element 1400 represents an example of the computing resources used to complete the transcoding, for example the cloud. The element 1500 represents an example of second encoded signals on a number of levels (from 1 to 6) and the associated resolutions and bit rates, as rendered by the cloud servers. It should be noted that the parameters indicated in the table 1500 can also be an example of the encoding information, in particular an example of the property parameters of the plurality of second encoded signals. In other words, the metadata 1200 can include a list or table of values in which a resolution and a bit rate as indicated in 1500 are associated with each level. On completion of the second encoding, the corresponding 8 levels as indicated in 1500 will be output accordingly.

The following is a further example illustrating the operation of the present invention and provided for illustrative purposes:

a pre-compressor generates the highest quality content necessary for distribution to a user in a common format (AVC or another format), called level 1, and during the compression process (including a initial pre-filtering) extracts a set of information related to the elements used for the first compression, which can subsequently be used to reconstruct the missing information. Thus the pre-compressor generates content/channels at a lower bit rate than is required by the common compression techniques used to generate mezzanines.

level 1 (with the associated information related to the compression) is sent to the cloud over the Internet;

a second compression (transcoding) is obtained in the cloud without decoding level 1. It envisages, starting from level 1 and the information on the pre-compression:

i) maintaining level 1 as it is, or else regenerating it based on the information associated with level 1;

ii) starting from level 1, generating the other desired levels, for example another 7 levels with lower resolutions and bit rates than level 1;

iii) obtaining the format desired for the final content.

As it is derived from a source of maximum quality, level 1 will be available at a quality that is in any case superior to that which may be obtained starting from a common mezzanine of, for example, 10 Mbps. In this manner the lower levels can be created/generated starting from a higher quality and thus with a higher efficiency and bandwidth savings for each level, the quality being equal, compared to the case in which the transcoding in the cloud is carried out in a manner that is not correlated with the first level 1 encoding.

A technical advantage of the present invention consists in a considerable reduction in the bandwidth that is needed for the broadcaster to send the content/channel to users over the Internet, because the operations of encoding/compressing all the levels distributed at a lower quality than level 1 are performed in the cloud in a distributed manner, thus optimising computing and data transmission resources.

Further technical advantages are that content is uploaded to the broadcaster using a greatly reduced bandwidth and the amount of computing resources used for transcoding depends on the real needs generated by user demands.

Moreover, the system reveals to be conducive to an efficient content distribution, over the Internet, to devices of different form and nature, with the extra advantage of enabling savings in transmission bandwidth since the resources necessary to generate the formats for distribution over the Internet are allocated to the cloud.

In addition, one obtains a result that is comparable to when compression is managed starting from content/channels at a high bit rate (the highest available in production), but the compression chain/process handled by the content provider or media company is simplified, thus reducing operating and infrastructural costs.

If the second encoding implies a compression, a further technical advantage of the present invention consists in a reduction in the computing resources and bandwidth used during this step, since previously pre-compressed content needs not be decompressed, but can rather be directly processed.

In the present description, reference has been made to means, such as, for example, an encoding means, to indicate any concentrated device (i.e. distinct or separate unit) or distributed device (i.e. constructed from a number of components connected to one another and physically near or remote from one another); the means, be they concentrated or distributed, can moreover be made up of hardware, software or a combination thereof. Moreover, terms such as encoding means, transmission means, etc. can also be replaced by encoder, transmitter, etc.

Many of the embodiments and examples have been illustrated with reference to steps of methods or processes. However, what has been described can also be implemented in a program to be run on a processing entity (which may also be distributed) or on an entity whose means is appropriately configured. As illustrated above, the entity can be implemented in a single device, via HW/SW or a combination thereof, or on multiple interconnected units or devices (similarly HW, SW or a combination thereof). Naturally, the above description of embodiments and examples applying the principles recognised by the inventors is given solely for the purpose of illustrating such principles and should therefore not be construed as limiting the scope of the invention claimed herein.

The invention claimed is:

1. A system for encoding an ungrouped signal into a plurality of grouped signals, said ungrouped signal comprising at least a video service, the system comprising:

a first encoding means provided in a production system configured to execute a first encoding of said ungrouped video signal into a first encoded grouped signal and to associate encoding information with said first encoded signal, said encoding information including information on a level of encoding of at least a part of the first encoded signal, and said first encoded signal being a first bit rate and first resolution;

a second encoding means provided in a distribution system, said second encoding means being separate from said first encoding means, and configured to execute a plurality of second encodings so as to correspondingly obtain said plurality of grouped signals, each of said plurality of grouped signals corresponding to a predetermined property including a second bit rate and a second resolution being smaller than the first bit rate and first resolution, respectively, said plurality of second encodings using said encoding information indicating that one or more frames of the first encoded grouped signal is to be further compressed, and said plurality of second encodings operating on the first encoded signal to reduce the second bit rate of the plurality of grouped signals; and a connection means configured to transmit said encoding information from said first encoding means to said second encoding means, wherein said encoding information comprises information on the first encoding, said encoding information including characteristic parameters representing properties of the first encoded signal indicating how the first encoding was performed.

2. The system according to claim 1, wherein at least one of said plurality of second encodings does not comprise a compression and at least another of said plurality of second encodings comprises a compression.

3. The system according to claim 1, wherein said encoding information further comprises information on at least one said corresponding predetermined property of one of said plurality of grouped signals.

4. The system as per claim 1, wherein the second encoding means is configured to execute one of said plurality of second encodings without decoding said first encoded signal.

5. The system according to claim 1, wherein said second encoding means is configured to execute one of said plurality of second encodings starting from the first encoded signal without the signal increasing in bandwidth during the execution of the second encoding.

6. The system as per claim 3, wherein the second encoding means is configured to execute one of said plurality of second encodings without decoding said first encoded signal.

7. The system according to claim 2, wherein said second encoding means is configured to execute one of said plurality of second encodings starting from the first encoded signal without the signal increasing in bandwidth during the execution of the second encoding.

8. The system according to claim 3, wherein said second encoding means is configured to execute one of said plurality of second encodings starting from the first encoded signal without the signal increasing in bandwidth during the execution of the second encoding.

9. The system according to claim 4, wherein said second encoding means is configured to execute one of said plurality of second encodings starting from the first encoded signal without the signal increasing in bandwidth during the execution of the second encoding.

10. The system according to claim 6, wherein said second encoding means is configured to execute one of said plurality of second encodings starting from the first encoded signal without the signal increasing in bandwidth during the execution of the second encoding.

11. The system of claim 1, wherein said encoding information indicating that one or more frames of the first encoded grouped signal are not further compressed.

12. A method for encoding an ungrouped signal into a plurality of grouped signals, said ungrouped signal comprising at least a video service, the method comprising the steps of:
   executing, via a first encoding means provided in a production system, a first encoding of said ungrouped video signal into a first encoded grouped signal and associating encoding information with said first encoded signal, said encoding information including information on a level of encoding of at least a part of the first encoded signal, and said first encoded signal being a first bit rate and first resolution;
   executing, via a second encoding means provided in a distribution system and distinct from said first encoding means, a plurality of second encodings so as to correspondingly obtain said plurality of grouped signals, each of said plurality of grouped signals corresponding to a predetermined property including a second bit rate and a second resolution being smaller than the first bit rate and first resolution, respectively, said plurality of second encodings using said encoding information indicating that one or more frames of the first encoded grouped signal is to be further compressed, and said plurality of second encodings operating on the first encoded signal to reduce the second bit rate of the plurality of grouped signals;
   transmitting said encoding information from said first encoding means to said second encoding means, wherein said encoding information comprises information on the first encoding, said encoding information including characteristic parameters representing properties of the first encoded signal indicating how the first encoding was performed.

13. The method according to claim 12, wherein at least one of said plurality of second encodings does not comprise a compression and at least another of said plurality of second encodings comprises a compression.

14. A non-transitory, computer-readable medium having computer-readable instructions stored therein which when executed by a computer, cause the computer to execute all of the steps according to the method of claim 12.

15. A non-transitory, computer-readable medium having computer-readable instructions stored therein which when executed by a computer, cause the computer to execute all of the steps according to the method of claim 13.

16. The method of claim 12, wherein said encoding information indicating that one or more frames of the first encoded grouped signal are not further compressed.

17. A device for encoding an ungrouped signal into a grouped signal, said ungrouped signal comprising at least a video service, said device comprising:
   an encoding means configured to execute a first encoding of said ungrouped video signal into a first encoded grouped signal and to associate encoding information with said first encoded signal, said encoding information including information on a level of encoding of at least a part of the first encoded signal, and said first encoded signal being a first bit rate and first resolution;
   a transmission means for transmitting said first encoded signal and encoding information to a further encoding device configured to execute a plurality of second encodings so as to correspondingly obtain a plurality of grouped signals, each of said plurality of grouped signals corresponding to a predetermined property including a second bit rate and a second resolution being smaller than the first bit rate and first resolution, respectively, said plurality of second encodings using said encoding information indicating that one or more frames of the first encoded grouped signal is to be further compressed, and said plurality of second encodings operating on the first encoded signal to reduce the second bit rate of the plurality of grouped signals, wherein said encoding information comprises information on the first encoding, said encoding information including characteristic parameters representing properties of the first encoded signal indicating how the first encoding was performed.

18. The device of claim 17, wherein said encoding information indicating that one or more frames of the first encoded grouped signal are not further compressed.

19. A device for encoding a first encoded grouped signal into a plurality of grouped signals, said first encoded grouped signal comprising at least a video service, said device comprising:
   a receiving means configured to receive said first encoded grouped signal and encoding information comprising encoding information on the first encoding from a further encoding device, said encoding information including information on a level of encoding of at least a part of the first encoded signal, and said first encoded signal being a first bit rate and first resolution;
   an encoding means configured to execute a plurality of second encodings so as to correspondingly obtain said plurality of grouped signals, each of said plurality of grouped signals corresponding to a predetermined property including a second bit rate and a second resolution being smaller than the first bit rate and first resolution, respectively, said plurality of second encodings using said encoding information indicating that one or more frames of the first encoded grouped signal is to be further compressed, and said plurality of second encodings operating on the first encoded signal to reduce the second bit rate of the plurality of grouped signals, wherein said encoding information comprises information on the first encoding, said encoding information including characteristic parameters representing properties of the first encoded signal indicating how the first encoding was performed.

20. The device of claim 19, wherein said encoding information indicating that one or more frames of the first encoded grouped signal are not further compressed.

\* \* \* \* \*